United States Patent [19]
Jenq et al.

[11] Patent Number: 5,937,307
[45] Date of Patent: Aug. 10, 1999

[54] PROCESS FOR FABRICATING DRAM CAPACITOR

[75] Inventors: Jason Jenq, Pingtung; Der-Yuan Wu, Hsinchu, both of Taiwan

[73] Assignee: United Microelectronics Corp., Taiwan

[21] Appl. No.: 09/041,526

[22] Filed: Mar. 12, 1998

[30] Foreign Application Priority Data

Dec. 19, 1997 [TW] Taiwan ................................. 86119306

[51] Int. Cl.$^6$ .................................................. H01L 21/20
[52] U.S. Cl. ............................................. 438/398; 438/255
[58] Field of Search .................................... 438/253, 255, 438/396, 398; 148/DIG. 14

[56] References Cited

U.S. PATENT DOCUMENTS

| | | | |
|---|---|---|---|
| 5,622,889 | 4/1997 | Yoo et al. | 438/398 |
| 5,721,153 | 2/1998 | Kim et al. | 438/398 |
| 5,726,085 | 3/1998 | Crenshaw et al. | 438/398 |
| 5,837,580 | 11/1998 | Thakur et al. | 438/398 |
| 5,837,581 | 11/1998 | Cheng | 438/255 |
| 5,837,582 | 11/1998 | Su | 438/398 |
| 5,854,095 | 12/1998 | Kang et al. | 438/255 |
| 5,858,852 | 1/1999 | Aiso et al. | 438/255 |
| 5,866,455 | 2/1999 | Wu | 438/255 |
| 5,874,336 | 2/1999 | Cherng | 438/255 |
| 5,877,052 | 3/1999 | Lin et al. | 438/238 |
| 5,885,867 | 3/1999 | Shin et al. | 438/396 |

*Primary Examiner*—Tuan H. Nguyen
*Attorney, Agent, or Firm*—Thomas, Kayden, Horstemeyer & Risley, L.L.P.

[57] ABSTRACT

A process of fabricating the storage capacitor of a DRAM memory IC device having increased electrode surface area is disclosed. The hemispherical-grain silicon layer used to effect the area increase does not suffer stripping-off during the process of removal of its native oxide. The prevention of the stripping-off is achieved by the employment of a amorphous silicon layer underlying the hemispherical-grain silicon layer. The amorphous silicon layer improves the adhesiveness of the hemispherical-grain silicon layer, thereby preventing its stripping-off.

15 Claims, 6 Drawing Sheets

PROCESS FOR FABRICATING DRAM CAPACITOR

CROSS-REFERENCE TO RELATED APPLICATION

This application claims the priority benefit of Taiwan application Ser. No. 86119306, filed Dec. 19, 1997, the full disclosure of which is incorporated herein by reference.

BACKGROUND OF THE INVENTION

1. Field of the Invention

This invention relates in general to a process for fabricating storage capacitors for DRAM memory cell units and, in particular, to a process for fabricating storage capacitors for DRAM memory cells having increased electrode surface area for improved capacitance.

2. Description of Related Art

Each of the memory cell units in the cell array of typical DRAM devices includes a MOS transistor and a storage capacitor. FIG. 1 illustrates the schematic diagram of the circuit of a memory cell unit in the DRAM memory array. As is illustrated, a transfer transistor T and a storage capacitor C constitute a basic memory cell unit for a DRAM. The source terminal of the transfer transistor T is connected to a corresponding bit line BL for the memory cell unit in the array, while the drain is connected to one electrode 15 of the storage capacitor C. Gate electrode of the transfer transistor T is strobed by a word line WL of the memory array system. Electrode 14 of storage capacitor C opposite to electrode 15 is connected to a fixed electrical potential of the DRAM system, for example, the ground potential. Sandwiched between the electrodes 15 and 14 of the storage capacitor C is a layer of dielectric material, schematically identified in the drawing by reference numeral 12.

The charging status in the capacitor of a specific memory cell unit represents the data storage in that particular memory location of the DRAM device. In other words, data bits can be stored in the storage capacitor of the memory cell unit utilizing the MOS transistor as the electrical switch to connect the capacitor to the supporting logic circuitry of the device for read-write operations. Sensed presence of electric charges in the storage capacitor can be used to interpret the binary value of the data stored in the cell unit.

Such a DRAM structural configuration, though suitable for mass production of large-scale DRAM memory cell arrays using modern semiconductor fabrication techniques, is constrained by a disadvantageous phenomenon of electric-charge leakage. Inherent characteristics of this basic structural configuration of the circuitry and the material used to implement this circuitry in large scale dictates that electric charges stored in the capacitor suffers leakage. Periodic refreshing operations has to be performed to maintain the charged status in these memory cell units. However, the refreshing operation eats away the available bandwidth of a DRAM device that can be used for normal access to the memory cell units.

There are several available measures to increase the DRAM device duty cycle by reducing the time percentage consumed by refresh operations. Among them are the efforts to increase the storage capacitor capacitance so that larger charge stored can endure longer refreshing cycles. These efforts include the increase of storage capacitor electrode surface area, optimized selection of material used to construct the capacitor dielectric layer, and the reduction of the thickness in the dielectric layer.

FIGS. 2A–2E respectively depict the cross-section views of a conventional DRAM memory cell unit in the process stages of its fabrication. In this depicted prior-art example, hemispherical-grain silicon (HSG-Si) was deployed over the top surface of the bottom electrode for the cell unit storage capacitor as a measure to increase the surface area of the capacitor electrode.

With reference to FIG. 2A, an insulation layer 22 is formed over the surface of the device substrate 20. The cross-sectional view shows that a contact opening is formed in this insulation layer 22 that exposes the surface of a specific source/drain region of the MOS transistor fabricated in the device substrate 20. Note that details of this MOS transistor are not elaborated in this drawing. The insulation layer 22 can be, for example, an interpolysilicon dielectric layer that serves to electrically isolate the MOS transistor with other portions of the other components in the cell unit. An electrically conductive material is then formed to cover the surface of the insulation layer 22, including the exposed surface of the MOS transistor source/drain region. This formed layer 24 may be, for example, a doped polysilicon layer that also fills into the contact opening formed in the insulation layer 22.

Then, as is illustrated in FIG. 2B, the surface of the electrically conductive layer 24 is then covered by an HSG-Si layer 26. This may be achieved by performing a low-pressure chemical vapor deposition (LPCVD) procedure in an $SiH_4$- or $Si_2H_6$-containing gaseous environment. The formed HSG-Si layer 26 can then be implanted with impurities in an ion implantation procedure which turns the HSG-Si layer 26 into an electrically conductive material.

In the process of the formation of the HSG-Si layer 26, a layer of native oxide is formed over its surface. Since the existence of such native oxides deteriorates the quality of the electrode for the storage capacitor, therefore a wet etching procedure is then employed to remove this native oxide by submerging the formed native oxide layer in etchants such as an RCA-HF solution. The RCA used may, for example, include $NH_4OH$/hot de-ionizing water (HDIW)/$H_2O_2$. This process of removing the native oxide layer formed over the surface of the HSG-Si layer, however, has a significant drawback. Due to the fact that the adhesion between the HSG-Si layer 26 and the polysilicon layer 24 directly underneath is not secure, some portions of the HSG-Si layer 26 may well be removed off the surface of the polysilicon layer 24 as a result of the native oxide-removal etching procedure. The etchant solution is thus polluted by the material of the stripped-off HSG-Si, thereby deteriorating the quality of etching to the native oxide layer.

Next, as is illustrated in FIG. 2C, a patterned photoresist layer 28 is then formed over the surface of the HSG-Si layer 26. This photoresist layer 28 covers the designated area of the surface of the HSG-Si layer 26 where the bottom electrode for the storage capacitor is to be formed. Then, subsequently in FIG. 2D, the photoresist layer 28 is employed as the shielding mask for implementing an etching procedure that removes the HSG-Si layer 26 and the conductive layer 24 exposed out of coverage of the masking. After this, the photoresist layer 28 can be removed. The result is the bottom electrode of the storage capacitor, generally identified by the reference numeral 25 in FIG. 2D. This capacitor bottom electrode 25 includes an electrically conductive layer 24a covered by the HSG-Si layer 26a.

Refer next to FIG. 2E, a dielectric material is then formed over the surface of the device substrate forming the dielectric layer 32. The dielectric layer 32 formed may be, for example, consisted of a triple-layered ONO (oxide/nitride/oxide) or a double-layered NO (nitride/oxide) configuration, or, it may be tantalum oxide ($Ta_2O_5$). Subsequent fabrication procedural steps can then be employed to shape them into the dielectric and top electrode layers respectively.

Such conventional fabrication process used for the formation of the HSG-Si layer, as mentioned above, suffers its poor adhesion to the underlying polysilicon layer. During the process of removal of the native oxide formed over its top surface, the HSG-Si layer itself may be damaged. Further, the factor of increase to the surface area of the bottom electrode by the employment of the HSG-Si layer is only about 70 percent larger, that is, a factor of about 1.7×.

SUMMARY OF THE INVENTION

It is therefore an object of the invention to provide a process for fabricating the storage capacitor having substantially increased electrode surface area.

It is another object of the invention to provide a process for fabricating the storage capacitor having substantially increased electrode surface area that is free of stripping-off of the hemispherical-grain silicon layer used to achieve the surface area increase.

It is still another object of the invention to provide a process for fabricating the storage capacitor having substantially increased electrode surface area that does not pollute the etchant used to remove the native oxide formed over the surface of the hemispherical-grain silicon layer.

The present invention achieves the above-identified objects by providing a process of fabricating the storage capacitor of a DRAM memory IC device that includes the steps of first forming an insulating layer over the surface of the device substrate of the device, with the device substrate containing the MOS transistor for the memory cell unit of the memory device. A contact openings are formed in the insulating layer revealing the surface of the source/drain region of the MOS transistor. A conductive layer is then formed covering the surface of the insulating layer and the exposed surface of the source/drain region inside the opening. The conductive layer is then patterned into the shape for the bottom electrode of the storage capacitor exposing the surface of the insulating layer. An amorphous silicon layer is then formed covering the surface of the conductive layer and the exposed surface of the insulating layer. A hemispherical-grain silicon layer then covers the surface of the amorphous silicon layer, with the portions not designated for the bottom electrode of the storage capacitor being removed. Dielectric layer and the top electrode of the storage capacitor are then formed.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DESCRIPTION OF THE PREFERRED EMBODIMENT

Figure 1:
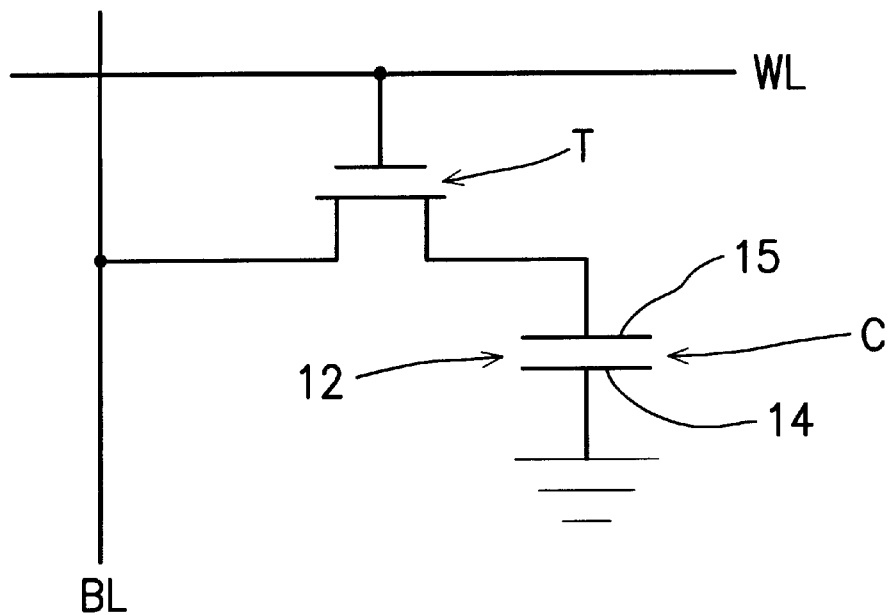
FIG. 1 illustrates the schematic diagram of the circuitry of a memory cell unit in the memory array of a typical DRAM device.
Figure 2A:
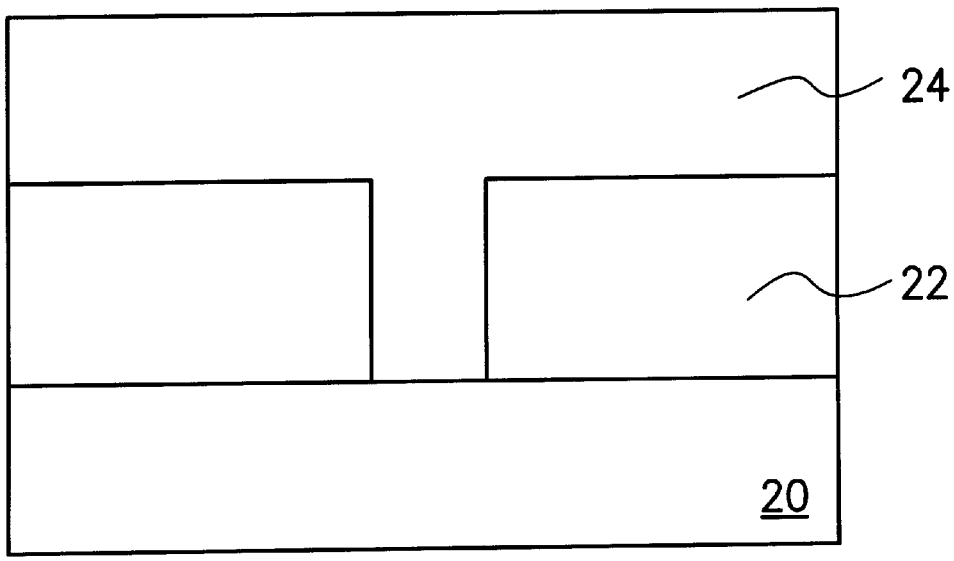
FIGS. 2A–2E respectively show the cross-sectional views of a conventional DRAM memory cell unit in the process stages of its fabrication.
Figure 2B:
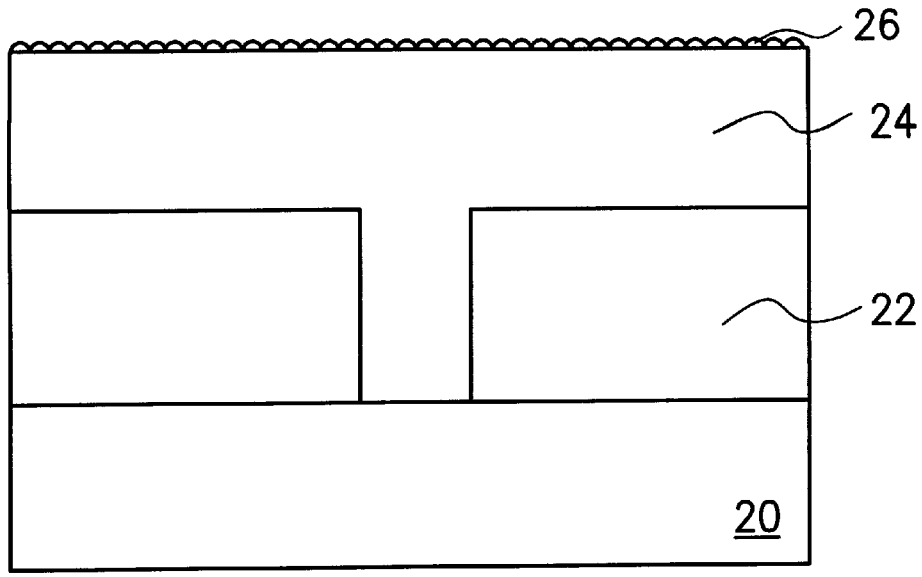
Figure 2C:
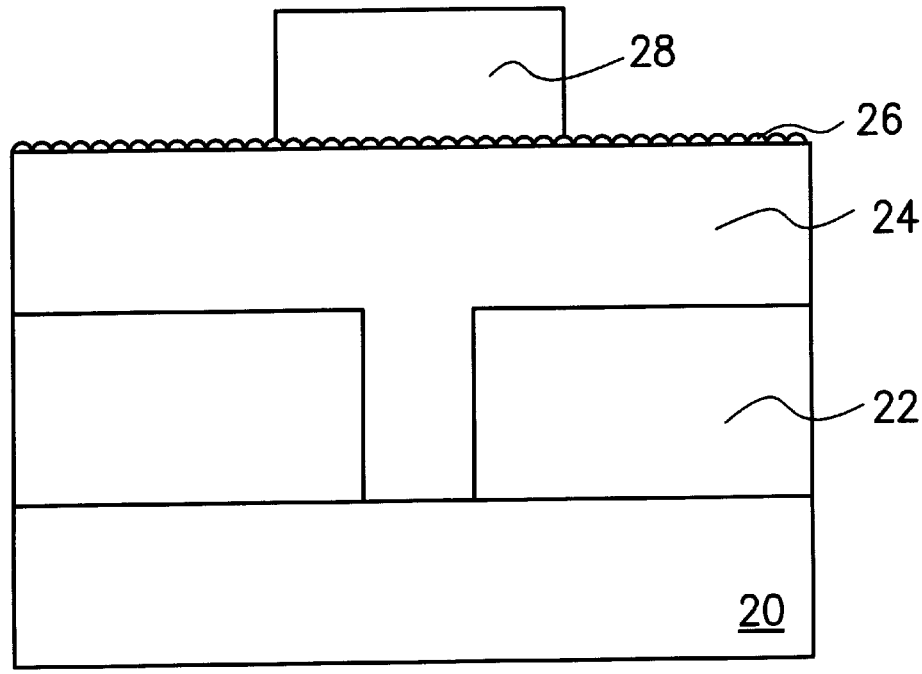
Figure 2D:
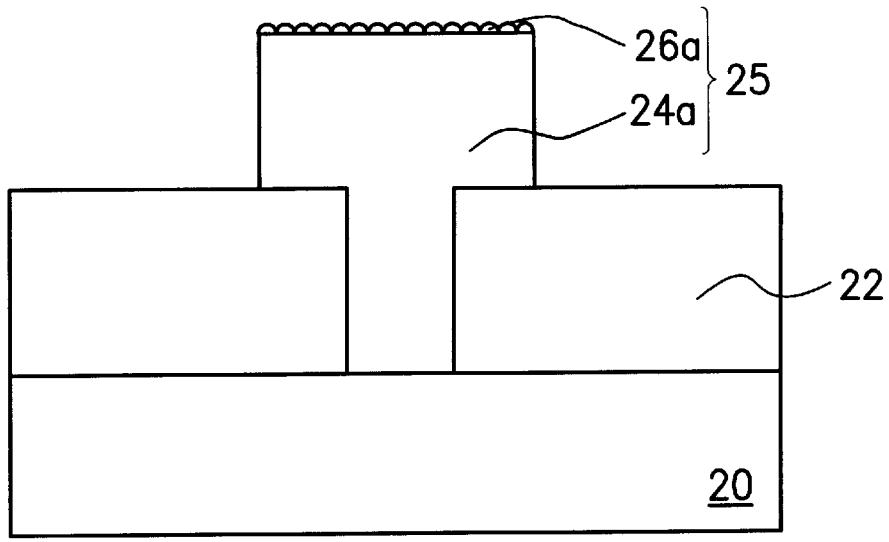
Figure 2E:
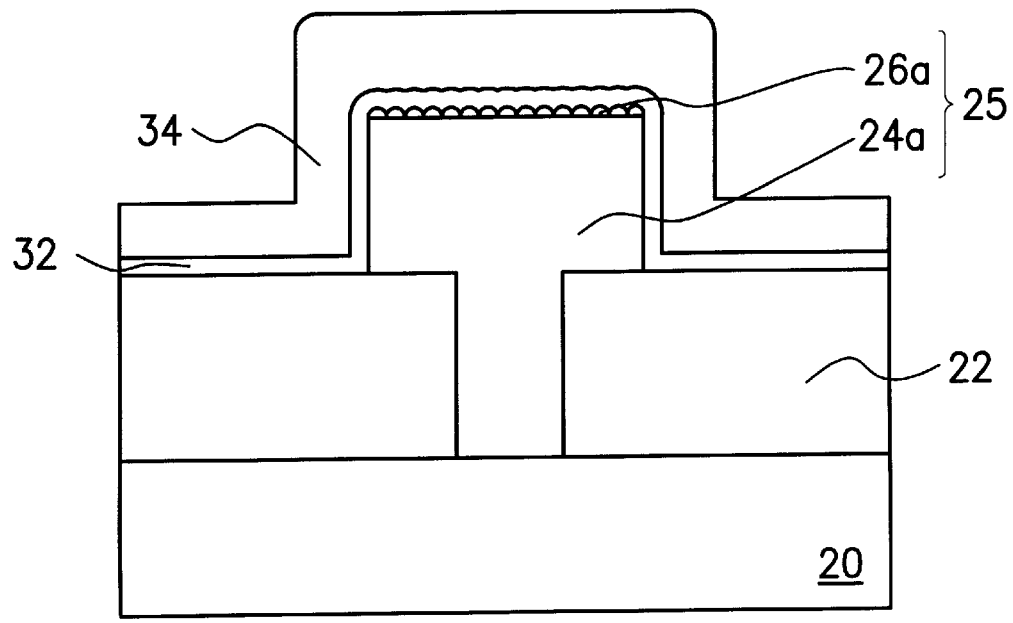
Figure 3B:
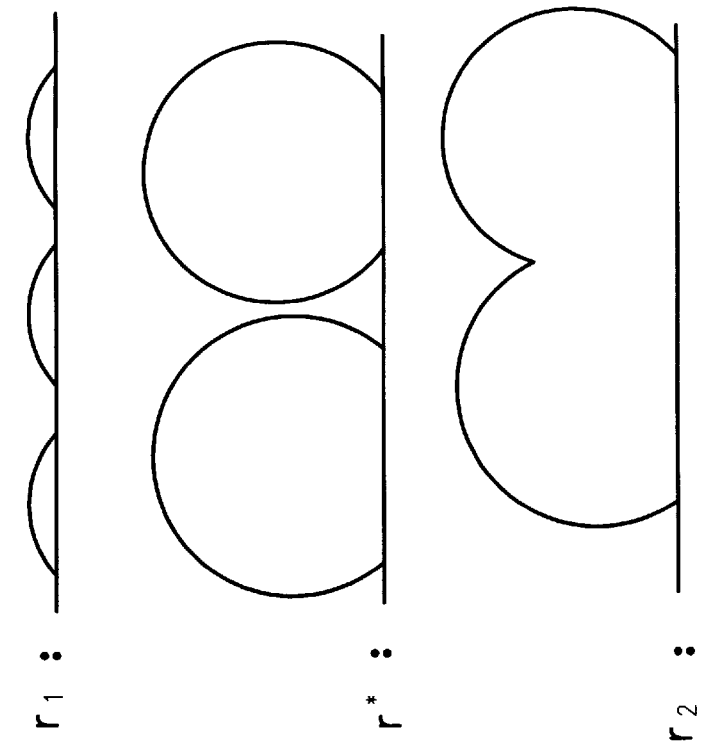
FIGS. 3A and 3B depict the relationship between the extent of surface area increase and the spherical characteristics of the HSG-Si layer formed.
Figure 3A:
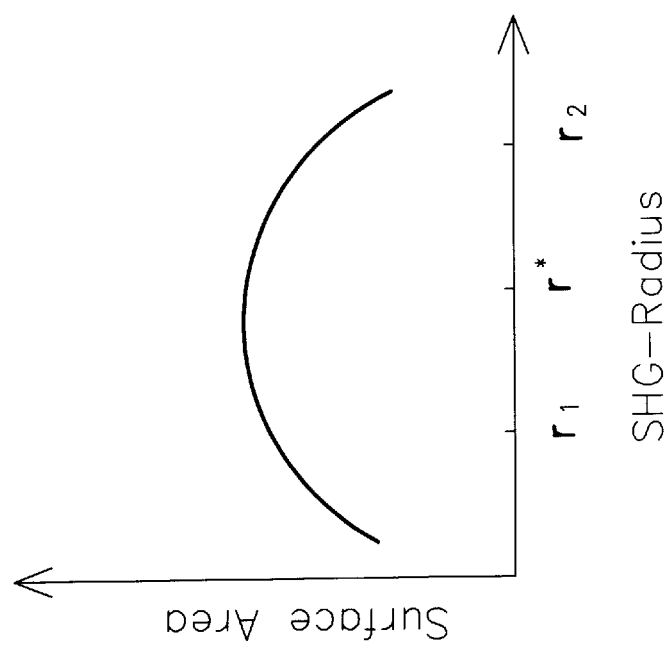

The idea of increasing the storage capacitor electrode surface area by the deployment of a layer of coarse material such as the HSG-Si layer is straight-forward. However, several factors determine how large an extent the increase may be achieved. These include the shape and size of the grains and the distance between the grains formed in the case when HSG-Si layer is used. FIGS. 3A and 3B together depict this relationship. In FIG. 3B, three HSG-Si layers having different grain sizes and average distance between formed grains are shown, with their corresponding surface area increase factor shown in FIG. 3A.

As can be observed in FIGS. 3A and 3B, when only a small fraction of the entire sphere is formed, or when a large fraction of the sphere is formed but closely pack together, as in the case of $r_1$ and $r_2$ in FIG. 3B respectively, the surface area increasing factor is not optimized, as is seen correspondingly in FIG. 3A. In the case of $r_1$ in FIG. 3B, the consecutive spheres formed are not connected to each other, but the overall curvature of the spheres are not significant to increase the entire surface area effectively. On the other hand, in the case of $r_2$ in FIG. 3B, although each of the spheres are formed to have large surface area, but the connection between consecutive ones of them reduces the overall surface area significantly. The optimization is the case in which a large fraction of the entire sphere is formed on top of the underlying layer, with a minimal distance preserved between the consecutive spheres, as in the case identified by $r^*$ in FIG. 3B. In general, the optimized distance between the consecutive spheres of the HSG-Si layer is about 0.1 $\mu$m.

FIGS. 4A–4E respectively show the cross-sectional views of a DRAM memory cell unit fabricated in accordance with a preferred embodiment of the invention. First, in the cross-sectional view of FIG. 4A, an insulation layer 102 is formed over the surface of the device substrate 100. A contact opening is formed in this insulation layer 102 that exposes the surface of the source/drain region of the MOS transistor fabricated in the device substrate 100. Again, note that details of this MOS transistor are not elaborated in this drawing. The insulation layer 102 can be, for example, an interpolysilicon dielectric layer that serves to electrically isolate the MOS transistor with other portions of the other components in the cell unit.

After the formation of the contact opening in the insulation layer 102, an electrically conductive material is then formed to cover the surface of the insulation layer 102, including the exposed surface of the MOS transistor source/drain region. This formed conductive layer 104 may be, for example, a doped polysilicon layer that also fills into the contact opening formed in the insulation layer 102. Next, on the surface of the conductive layer 104, a patterned photoresist layer 108 is then formed covering the area where bottom electrode for the storage capacitor is to be formed.

Figure 4A:
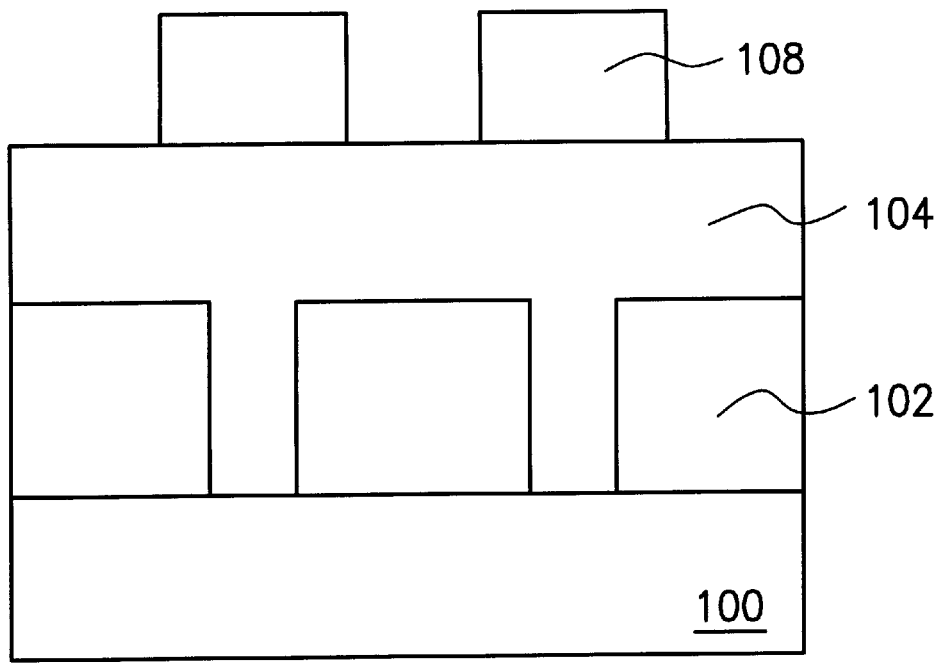
FIGS. 4A–4E respectively show the cross-sectional views of a DRAM memory cell unit in the process stages of its fabrication as fabricated in accordance with a preferred embodiment of the invention.
Figure 4B:
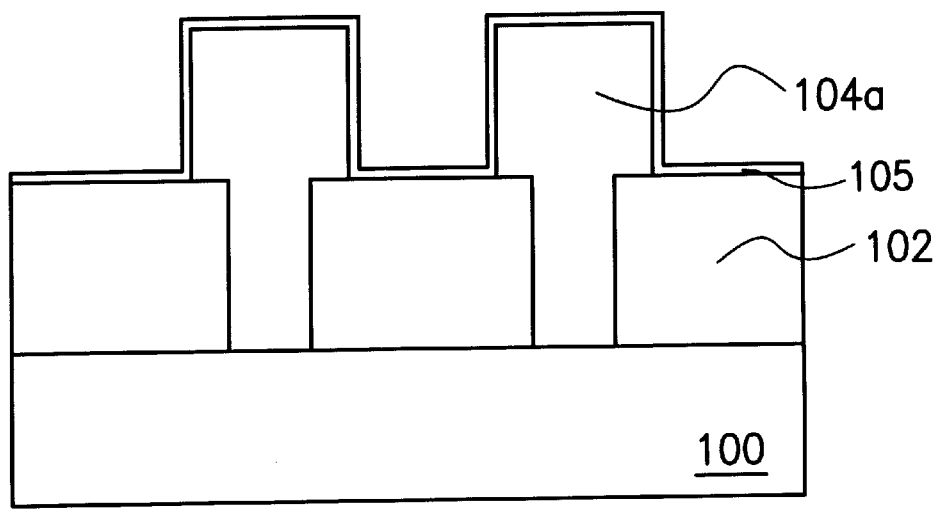

Then, the photoresist layer 108 is used as the shielding mask for the implementation of an etching procedure that removes the portions of the conductive layer 104 that are exposed out of the shielding coverage. After this, the photoresist layer 108 is then removed. The result is the conductive layer 104a shaped to be used as the bottom electrode for the storage capacitor as is illustrated in FIG. 4B.

In order to prevent the stripping-off of the HSG-Si layer as was described above in the conventional fabrication procedure, a thin layer of amorphous silicon 105 is formed over the surface of the conductive layer 104a. This layer may be used to improve the adhesiveness of the conductive layer 104a in the subsequent HSG-Si layer formation procedure. An LPCVD procedure can be used to form this amorphous silicon layer 105 at a temperature of about 575° C., and the thickness of the amorphous silicon deposited is about 300Å.

Figure 4C:
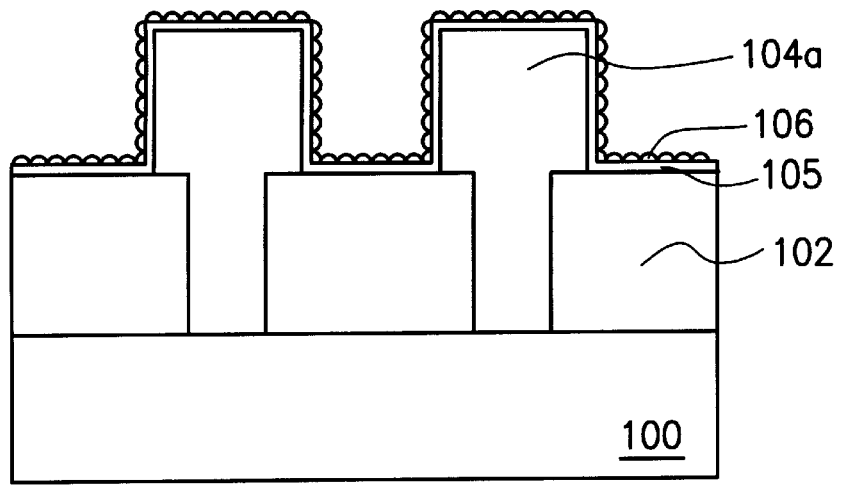

Refer next to FIG. 4C. With the amorphous silicon layer 105 covering the surface of the device substrate, an HSG-Si layer 106 can be formed over the surface of the amorphous silicon layer 105. This may be achieved by performing an LPCVD procedure in an $SiH_4$- or $Si_2H_6$-containing gaseous environment. The formed HSG-Si layer 106, together with its underlying amorphous silicon layer 105, can then be implanted with impurities in an ion implantation procedure. This turns the HSG-Si layer 106 and the amorphous silicon layer 105 underneath into an electrically conductive material suitable to be used as the surface layer of the storage capacitor bottom electrode.

In the process of the formation of the HSG-Si layer 106, a native oxide is formed over its surface. As already indicated, since the existence of such native oxides deteriorates the quality of the electrode for the storage capacitor, a wet etching procedure is then employed to remove this native oxide. This may be done by submerging the formed native oxide layer in etchants such as a 100-to-1 RCA-HF solution for about 60–300 seconds. The RCA used may, for example, include $NH_4OH/HDIW/H_2O_2$, or, a buffered oxide etchant (BOE) can be used.

The presence of the amorphous silicon layer 105 between the conductive layer 104a and the HSG-Si layer 106 is effective in preventing the stripping-off of the HSG-Si when the native oxide-removal etching procedure is performed. This is because of the improved adhesion between the HSG-Si layer 106 and the amorphous silicon layer 105 itself. Without substantial stripping-off of the HSG-Si layer, the etchant quality can be maintained to prevent deterioration of the surface quality of the HSG-Si layer.

Figure 4D:
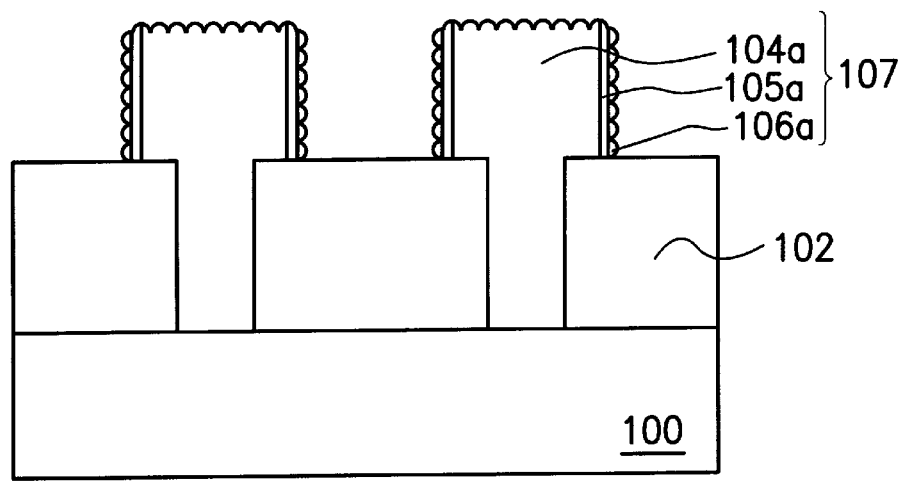

Refer to FIG. 4D. Portions of the HSG-Si layer 106 formed between the bottom electrodes for the consecutive cell units must be removed to prevent undesirable short-circuiting. The amorphous layer 105 covering the insulation layer 102 between the bottom electrodes is also removed as a consequence of the removal of the portions of the HSG-Si layer 106. These HSG-Si portions may be removed in an etching-back procedure employing a dry etchant. This dry etching-back procedure also removes the portion of the HSG-Si layer 106 formed on top of the bottom electrodes. Due to the fact that the surface of the HSG-Si layer 106 on top of the bottom electrodes was coarse surface, therefore the top surface of the conductive layer 104a revealed after the implementation of this etching-back procedure is also coarse in nature, as is schematically illustrated in FIG. 4D. This ensures that the surface area increase as brought about by the deployment of the HSG-Si layer can be substantially sustained even though the portion of the HSG-Si layer 106 on top of the conductive layer 104a has been removed. This results in a bottom electrode structural configuration 107 constituting of the conductive layer 104a, the amorphous silicon layer 105a, and the HSG-Si layer 106a.

Figure 4E:
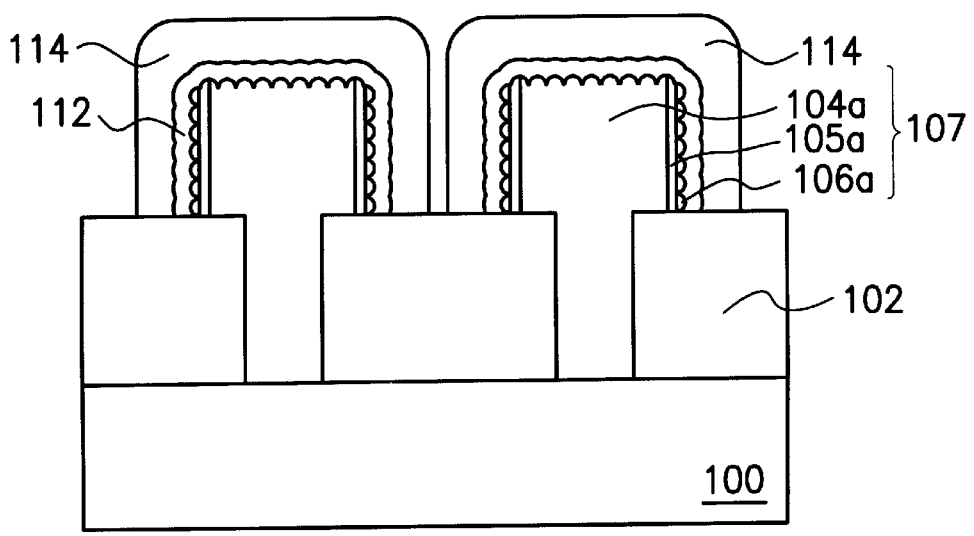

Refer next to FIG. 4E, a dielectric material is then formed over the surface of the device substrate resulting into the dielectric layer 112. The dielectric layer 112 formed may be, for example, consisted of a triple-layered ONO or a double-layered NO configuration, or, it may be constituted of a tantalum oxide, $Ta_2O_5$. Subsequent fabrication procedural steps can then be employed to shape into the dielectric and top electrode layers 112 and 114 respectively.

Thus, the process of the invention for fabricating the bottom electrode for storage capacitors in DRAM memory cell units is advantageous in that the electrode surface area may be substantially increased. The surface increase is more than that on the top surface of the bottom electrode, as can be observed in the cross-sectional view of FIG. 4E. The sidewall surface of the bottom electrode is also covered by the surface area-increasing HSG-Si layer. In addition, during the process of the removal of the native oxide formed over the surface of the HSG-Si layer, the probability of stripping-off of portions of the HSG-Si layer is reduced substantially as a result of improved adhesion between the HSG-Si layer and its underlying amorphous silicon layer.

While the invention has been described by way of example and in terms of preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A process of fabricating a storage capacitor of a dynamic random access memory of an integrated circuit comprising the steps of:

forming an insulating layer over a surface of a substrate of the integrated circuit, the substrate comprising a metal-oxide semiconductor transistor for a dynamic random access cell unit of the integrated circuit, with a contact opening formed in the insulating layer revealing a surface of a source/drain region of the transistor;

forming a conductive layer covering a surface of the insulating layer and an exposed surface of the source/drain region inside the contact opening, the conductive layer being patterned into a shape for a bottom electrode of the storage capacitor exposing the surface of the insulating layer;

forming an amorphous silicon layer covering the surface of the conductive layer and the exposed surface of the insulating layer;

forming a hemispherical-grain silicon layer covering a surface of the electrode comprising the patterned conductive layer, a course top surface and a sidewall covered by the amorphous silicon layer and the hemispherical-grain silicon layer is formed;

removing portions of the hemispherical-grain silicon layer and portions of the amorphous silicon layer not designated for the bottom electrode of the storage capacitor; and forming a dielectric layer and a top electrode of the storage capacitor on the dielectric layer.

2. The process of fabricating storage capacitor according to claim 1, wherein the conductive layer is a polysilicon layer implanted with impurities.

3. The process of fabricating storage capacitor according to claim 1, wherein the amorphous silicon layer is formed in a low-pressure chemical vapor deposition procedure conducted at a temperature of about 575° C.

4. The process of fabricating storage capacitor according to claim 3, wherein the amorphous silicon layer is deposited to a thickness of about 300.

5. The process of fabricating storage capacitor according to claim 1, wherein the hemispherical-grain silicon layer is formed in a low-pressure chemical vapor deposition procedure conducted in an $SiH_4$-containing gaseous environment.

6. The process of fabricating storage capacitor according to claim 1, wherein the hemispherical-grain silicon layer is formed in a low-pressure chemical vapor deposition procedure conducted in an $Si_2H_6$-containing gaseous environment.

7. The process of fabricating a storage capacitor according to claim 1, wherein the step of forming the hemispherical-grain silicon layer further comprising the steps of:

implanting impurity ions into the hemispherical-grain silicon layer; and removing a native oxide layer formed over the surface of the hemispherical-grain.

8. The process of fabricating storage capacitor according to claim 7, wherein the step of removing the native oxide comprises etching the hemispherical-grain silicon layer in a 100-to-1 RCA-HF solution for about 60–300 seconds.

9. The process of fabricating storage capacitor according to claim 7, wherein the step of removing the native oxide comprises etching the hemispherical-grain silicon layer in a buffered oxide etchant.

10. The process of fabricating storage capacitor according to claim 1, wherein the step of removing the portions of the hemispherical-grain silicon layer not designated for the bottom electrode of the storage capacitor comprises etching in a dry-etching procedure.

11. The process of fabricating storage capacitor according to claim 1, wherein the dielectric layer comprises a triple-layered oxide/nitride/oxide composite structural configuration.

12. The process of fabricating storage capacitor according to claim 1, wherein the dielectric layer comprises a double-layered nitride/oxide composite structural configuration.

13. The process of fabricating storage capacitor according to claim 1, wherein the dielectric layer is a tantalum oxide layer.

14. The process of fabricating storage capacitor according to claim 1, wherein the top electrode is a doped polysilicon layer.

15. A method for forming a storage capacitor of a dynamic random access memory, comprising:

providing a substrate having a metal-oxide semiconductor which comprises a source/drain region in the substrate;

forming an insulating layer with a contact opening exposing the source/drain region;

forming a patterned conductive layer to cover a portion of the insulating layer and to fill the contact opening;

forming an amorphous silicon layer to cover the patterned conductive layer and the insulating layer uncovered by the patterned conductive layer;

forming a hemispherical-grain silicon layer to cover the amorphous layer with a native oxide layer thereon;

removing the native oxide layer; and removing portions of the hemispherical-grain silicon layer and portions of the amorphous silicon layer.

* * * * *